United States Patent [19]

Darms et al.

[11] Patent Number: 4,562,119
[45] Date of Patent: Dec. 31, 1985

[54] FLEXIBLE, PRINTED CIRCUIT

[75] Inventors: Roland Darms, Therwil; Harry Beyeler, Basel; Theobald Haug, Frenkendorf, all of Switzerland

[73] Assignee: Ciba-Geigy Corporation, Ardsley, N.Y.

[21] Appl. No.: 641,893

[22] Filed: Aug. 17, 1984

Related U.S. Application Data

[63] Continuation-in-part of Ser. No. 531,589, Sep. 13, 1983, abandoned, which is a continuation of Ser. No. 422,424, Sep. 23, 1982, abandoned, which is a continuation of Ser. No. 298,965, Sep. 3, 1981, abandoned.

[30] Foreign Application Priority Data

Sep. 15, 1980 [CH] Switzerland .......................... 6905/80

[51] Int. Cl.$^4$ ............................................. B32B 15/08
[52] U.S. Cl. ..................................... 428/458; 428/450; 428/473.5; 428/901; 528/26; 528/28; 528/38; 361/398; 174/68.5
[58] Field of Search ...................... 428/458, 450, 473.5, 428/901; 528/26, 28, 38; 174/68.5; 361/398

[56] References Cited

U.S. PATENT DOCUMENTS

| | | |
|---|---|---|
| 3,809,591 | 5/1974 | Vogelfanger et al. |
| 3,894,114 | 7/1975 | Lohmann .................... 260/857 PA |
| 3,948,835 | 4/1976 | Gerber ............................ 260/78 SC |
| 4,200,724 | 4/1980 | Darms et al. ......................... 528/26 |

OTHER PUBLICATIONS

E. Behr, "Hochtemperatur–Beständige Kunststoffe", Carl Hauser, Munich, 1969, p. 79.

*Primary Examiner*—Edith Buffalow
*Attorney, Agent, or Firm*—Luther A. R. Hall

[57] ABSTRACT

A flexible, printed circuit with excellent adhesion of the printed tracks, which is obtained by coating one side of a metal foil without an intermediate layer with a polymer consisting of a polyamide, polyimide or polyamide-imide containing siloxane groups, which is obtainable by crosslinking a silicon-modified polyamide prepolymer, polyamide-acid prepolymer or polyamide-amido-acid prepolymer of the formula I, heating the coated metal foil in the temperature range from 50° to 300° C. till a tack-free coating is obtained, exposing the opposite side of the coated metal foil, which side is provided with a photolacquer, through a photo mask, and developing the exposed metal foil.

5 Claims, No Drawings

FLEXIBLE, PRINTED CIRCUIT

This is a continuation-in-part of application Ser. No. 531,589, filed Sept. 13, 1983, now abandoned which in turn is a continuation of application Ser. No. 422,424, filed Sept. 23, 1982, now abandoned, which in turn is a continuation of application Ser. No. 298,965, filed Sept. 3, 1981, now abandoned.

The present invention relates to flexible printed circuits obtained by coating one side of a metal foil with a polyamide, polyimide or polyamide-imide containing siloxane groups, the other side with a photolacquer, exposing this side through a photo mask, and developing the exposed metal foil.

It is known that flexible printed circuits offer numerous technical advantages over rigid printed circuits. They are easier to handle, since they can be inserted in virtually any shape as an electronic component into the system concerned, accordingly occupy less space in the electrical equipment, and are also less sensitive to vibrations.

However, the flexible base material, namely the insulant-coated metal foil, which is used to produce printed circuits, has to conform to high standards. The coating must exhibit very good adhesion to the metal foil and must withstand, without damage, the operations involved in the production of printed circuits, i.e. the coating must have good resistance to a soldering bath and good resistance to the solvents employed in printed circuit technology. Furthermore, it must be possible to bend, roll, twist and fold the flexible base material without cracking or flaking-off of the coating.

Metal foils coated with polyimide films and obtained by laminating a polyamide film to a copper foil carrying a binder do not conform to all aspects of these requirements; in particular, the electrical properties leave something to be desired. The binder used, and the bonding process employed, are amongst the factors which determine the properties of such laminates.

Further, it is known from U.S. Pat. No. 3,682,960 to coat metals with a mixture of a polyamide-acid and an amide-modified polyamide-acid. The coatings of polyimides and polyamide-imides obtained on the metals after heating however suffer from the disadvantage that they are insufficiently flexible and easily flake off the metal foil.

To circumvent these disadvantages, U.S. Pat. No. 4,148,969 consequently proposes to use laminates of metal foils coated with polyparabanic acids, the polyparabanic acid used being prepared by hydrolysis of the reaction product of diphenylmethane diisocyanate with hydrogen cyanide. Apart from the fact that the preparation of the polyparabanic acid used is complicated, hydrogen cyanide has to be employed in the preliminary stage, for which additional precautionary measures must be taken.

It has now been found that flexible base materials consisting of polymer films which adhere firmly, without an intermediate layer, to metal foils are obtained in a simpler manner if the metal foil is coated with an organic solution of a silicon-modified polyamide, polyamide-acid or polyamide-amidoacid prepolymer and the coating is hardened by heating, with evaporation of the organic solvent.

Accordingly, the present invention relates to a flexible, printed circuit with excellent adhesion of the printed circuit tracks, which is obtained by coating one side of a metal foil without any interlayer with a polymer consisting of a polyamide, polyimide or polyamide-imide which contains siloxane groups, the silicon content being 0.1 to 2.0% by weight, and is obtained by heating a silicon-modified polyamide prepolymer, polyamide-acid prepolymer or polyamide-amido-acid prepolymer, of intrinsic viscosity from 0.3 to 4.0, of the formula I

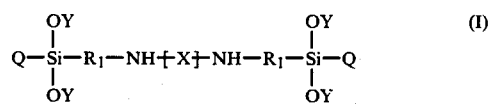

in which X is a structural element of the formula II

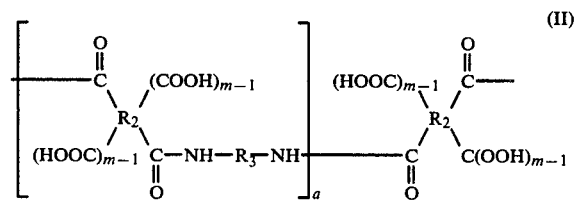

a is a number from 15 to 100 and the individual symbols or radicals m, $R_1$, $R_2$, $R_3$, Q and Y, independently of one another, are defined as follows: m is 1 or 2, $R_1$ is a

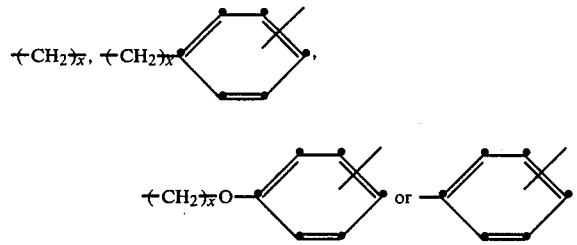

radical, x being a number from 1 to 4, $R_2$ is a carbocyclic-aromatic or heterocyclic radical, in which the carboxamide groups and carboxyl groups are bonded to different ring carbon atoms and the carboxyl groups are each in the ortho-position to a carboxamide group, $R_3$ is a carbocyclic-aromatic or heterocyclic radical, Q is methyl, phenyl or a radical —OY and Y is an alkyl radical of 1 to 6 carbon atoms or a phenyl radical, heating the coated metal foil in the temperature range from 50° to 300° C. till a tack-free coating is obtained, exposing the opposite side of the coated metal foil, which side is provided with a photolacquer, through a photo mask, and developing the exposed metal foil.

Preferably, the circuit according to the invention contains a copper foil as the metal foil.

The polymer which adheres firmly to the metal foil preferably consists of a crosslinked polyamide, polyimide or polyamide-imide containing siloxane groups and is obtained by heating a silicon-modified prepolymer of the formula I, wherein a is a number from 50 to 100 and m, $R_1$, $R_2$, $R_3$, Q and Y are as defined for formula I, at temperatures of between 50° and 350° C.

In particular, the polymers consist of crosslinked polyamides, polyimides or polyamide-imides which contain siloxane groups and which are obtained by heating the prepolymers of the formula I, wherein the individual radicals $R_2$ independently of one another are each an unsubstituted monocyclic, fused polycyclic, or non-fused bicyclic aromatic radical, the aromatic nuclei in the last-mentioned case being linked by the bridge member —O— or —CO—, the individual radicals $R_3$, independently of one another, are each an unsubstituted monocyclic or bicyclic aromatic radical, the aromatic nuclei in the last-mentioned case being linked by a bridge member —O—, —$CH_2$—, —$C(CH_3)_2$— or —$SO_2$— or by a direct bond, and m, $R_1$, Q and Y are as defined for formula I, at temperatures of between 50° and 350°.

In a particular embodiment, the circuit carries a coating of a polyimide which is obtained by heating a silicon-modified prepolymer of the formula I, wherein m is 2, $R_2$ is a benzene ring or the benzophenone ring system and $R_3$ is a 4,4'-diphenyl-ether or 4,4'-diphenylmethane radical, and $R_1$, Q and Y are as defined for formula I.

The silicon-modified polyamide prepolymers, polyamide-acid prepolymers and polyamide-amidoacid prepolymers used to coat the metal foils are known from German Offenlegungsschrift No. 2,426,885 and can be prepared by the processes described therein, for example by reacting a polyamide, or polyamide-amidoacid having 2 anhydride terminal groups, or polyamide-aminoacid having one acid chloride terminal group and one anhydride terminal group, these polyamides or polyamide-amidoacids corresponding to the formula II, with not less than 2 mols of an aminosilane of the formula III

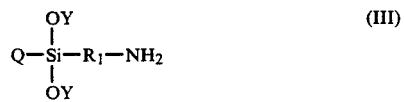

in which a, m, $R_1$, $R_2$, $R_3$, Q and Y are as defined for formula I.

The abovementioned German Offenlegungsschrift futher discloses that the polyamide prepolymers, polyamideacid prepolymers and polyamide-amidoacid prepolymers, containing siloxane groups, can be used for coating or gluing substrates of very diverse kinds, such as metals, polymers or cellulosic materials, but contains no indication that the metal foils coated with the prepolymers are extremely flexible, i.e. withstand repeated bending and folding without cracking of the polymer film, and furthermore have good resistance to a soldering bath and good resistance to the solvents employed in printed circuit technology.

The silicon-modified polyamide prepolymers, polyamide-acid prepolymers and polyamide-amidoacid prepolymers used preferably have an intrinsic viscosity of 0.5 to 2.5.

The intrinsic viscosity $\eta_{int.}$, which is a measure of the molecular weight of a polymer, is calculated from the following equation:

$$\eta_{int.} = \frac{\ln \frac{\eta}{\eta_0}}{c}$$

wherein ln=natural logarithm, $\eta$=viscosity of the solution (0.5% by weight of polymer in a suitable solvent, for example N,N-dimethylacetamide, N,N-dimethylformamide or N-methylpyrrolidone), $\eta_0$=viscosity of the solvent and c=concentration of the polymer solution in g of polymer/100 ml of solvent.

The viscosity measurements are carried out at 25° C. As is generally known, the intrinsic viscosity is a measure of the molecular weight of a polymer. The quoted values of $\eta_{int.}$=0.3 to 4.0 correspond to mean molecular weights of about 4,000 to 50,000. The mean molecular weight can be determined by methods known per se, for example by means of light scattering.

The prepolymers containing structural units X of the formula II, in which the individual indices or radicals m, $R_2$ and/or $R_3$ can have different meanings, can be homopolymers or copolymers having a random distribution or any desired, at least partially block-like, arrangement of the polyamide, polyamide-acid and/or polyamide-amidoacid units in the structural element X.

The silicon-modified prepolymers, which are preferably prepared in an anhydrous organic solvent and with exclusion of moisture, are advantageously used in the form of these organic solutions. Suitable organic solvents are N,N-dimethylacetamide, N,N-diethylacetamide, N,N-dimethylformamide, N,N-dimethylmethoxyacetamide, N-methyl-2-pyrrolidone, N-acetyl-2-pyrrolidone, N-methyl-ε-caprolactam, hexamethylphosphorotriamide (hexametapol), N,N,N',N'-tetramethylurea, tetrahydrothiophene dioxide (sulfolan) and dimethylsulfoxide. Mixtures of such solvents can also be used. On the other hand, it is also possible to dilute these preferred solvent systems with other organic aprotic solvents, such as aromatic, cycloaliphatic or aliphatic hydrocarbons, which can be chlorinated, for example benzene, toluene, xylenes, cyclohexane, pentane, hexane, petroleum ether, methylene chloride, tetrahydrofuran, cyclohexanone and dioxane.

In order to increase the shelf life of the organic solution of the silicon-modified prepolymer, it is advantageous to add a water-absorbing substance, for example a molecular sieve, to the solution. Molecular sieves are advantageously introduced in amounts of about 10 per cent by weight, based on the amount of the organic solution. The molecular sieves are commercially available products, for example from Merck.

Surprisingly, it has also been found that it is advantageous to add a flow control agent, for example "Modaflow" (a commercial product from Monsanto) to the organic solutions of the silicon-modified prepolymers, prior to processing.

The coating of the metal foils with the organic polymer solutions can be carried out manually or with coating machines, including vertical coating machines. However, in the case of machine coating it is important that a non-tacky coating be obtained on the metal foil, so that the laminate can, if desired, be rolled up. To achieve optimum properties, the laminate can subsequently be heated at higher temperatures, for example 4 hours at 180° C. and 2 hours at 250° C., which results in virtually complete cyclisation and crosslinking of the polyamide-acid prepolymers and polyamide-amidoacid prepolymers to the corresponding polyimides and polyamide-imides.

The metal foils coated in this way can be used direct for the production of printed circuits, by exposing the foil, provided with a photo-resist lacquer on the metal face, through a photographic mask and developing the exposed metal foil in a known manner. This results in flexible printed circuits of great mechanical strength.

EXAMPLE 1

A. Preparation of a silicon-modified polyamide-acid prepolymer 13.741 g (0.0630 mol) of pyromellitic dianhydride are suspended in 60 g of anhydrous N,N-dimethylacetamide, by stirring under nitrogen in a sulfonation flask equipped with a stirrer, internal thermometer, dropping funnel, gas inlet tube and pressure-balancing vessel. The suspension is cooled to 10° C., with stirring. A clear solution of 12.133 g (0.060 mol) of 4,4'-diaminodiphenylmethane in 50 g of anhydrous N,N-dimethylacetamide is then prepared by stirring at 45° C. The solution is cooled to 10° C. and added dropwise in the course of 1 hour, at 10° C., to the suspension; during the addition, the pyromellitic dianhydride slowly dissolves and the reaction mixture becomes distinctly viscous, clear and pale yellow. The reaction is then completed by allowing a further 30 minutes at 10°–15° C. 1.327 g (0.006 mol) of γ-aminopropyltriethoxysilane, dissolved in 15 g of anhydrous N,N-dimethylacetamide, are then added dropwise, in the course of 30 minutes, to the viscous mixture, with stirring at 10°–15° C. The reaction is then completed by allowing a further 30 minutes at room temperature. A clear, pale yellow, viscous solution of a polyamide-acid prepolymer, containing terminal triethoxysilyl groups and having an intrinsic viscosity of 1.1 dl/g (c=0.5% in N,N-dimethylacetamide) is obtained, which can be used direct for coating Cu foil.

B. Preparation of a coated copper foil

The solution of the above prepolymer is spread uniformly, by means of a doctor, on Cu foils, and the coated foil is predried for 7 hours at 70°–150°/20 mbar and is thereby freed from solvent. The laminates are then heat-treated for 10 hours at 200°–250° C./0.10 mbar. Firmly adhering, flexible, transparent coatings, having a smooth surface, are obtained on the Cu foils. The coated Cu foils have excellent electrical properties.

Stability of the coated Cu foils in chlorinated hydrocarbons at room temperature

|  | 7 days | 14 days | 30 days | 60 days |
| --- | --- | --- | --- | --- |
| Chloroform | i.o.* | i.o. | i.o. | i.o. |
| Chlorobenzene | " | " | " | " |
| Carbon tetrachloride | " | " | " | " |
| Methylene chloride | " | " | " | " |
| Ethylene chloride | " | " | " | " |
| 1,1,1-Trichloromethane | " | " | " | " |

*i.o. = in order (no attack)

Etching test in an FeCl₃ bath

The coated Cu foils are placed in an iron-III chloride bath (30% aqueous solution) and the bath is agitated by passing a slight stream of air through it. The films remain flexible after the copper has been etched away.

EXAMPLE 2

A. Preparation of a silicon-modified polyamide-acid prepolymer 65.44 g (0.300 mol) of pyromellitic dianhydride are suspended in 350 g of anhydrous N,N-dimethylacetamide by stirring under nitrogen in a sulfonation flask equipped with a stirrer, internal thermometer, dropping funnel, gas inlet tube and pressure-balancing vessel. The suspension is cooled to −15° C., with stirring. A clear solution of 59.070 g (0.295 mol) of 4,4'-diaminodiphenyl ether in 300 g of anhydrous N,N-dimethylacetamide is then prepared by stirring. This solution is added dropwise to the suspension in the course of 1 hour, at −15° C. to −10° C., during which time the pyromellitic dianhydride slowly dissolves and the reaction mixture becomes distinctly viscous, clear and yellowish. The reaction is then completed by allowing a further 30 minutes, at 0°–5° C. 2.212 g (0.100 mol) of γ-aminopropyltriethoxysilane are then dissolved in 65 g of anhydrous N,N-dimethylacetamide. This solution is added dropwise, in the course of 30 minutes, to the viscous solution, with stirring. The reaction is then completed by allowing a further 30 minutes, at 0° to 5° C. A clear, viscous, yellowish solution of a polyamide-acid prepolymer, containing terminal triethoxysilyl groups and having an intrinsic viscosity of 1.2 dl/g (c=0.5% in N,N-dimethylacetamide) is obtained, which can be used direct for coating Cu foils.

B. Preparation of a coated copper foil

The solution of the above prepolymer is spread uniformly, by means of a doctor, on Cu foils, and the coated foil is predried for 7 hours at 70°–150°/20 mbar and is thereby freed from solvent. The laminates are then heat-treated for 10 hours at 200°–250° C./0.10 mbar. Firmly adhering, flexible, transparent coatings, having a smooth surface, are obtained on the Cu foils. The coated Cu foils have excellent electrical properties.

Stability of the coated Cu foils in chlorinated hydrocarbons at room temperature

|  | 7 days | 14 days | 30 days | 60 days |
| --- | --- | --- | --- | --- |
| Chloroform | i.o.* | i.o. | i.o. | i.o. |
| Chlorobenzene | " | " | " | " |
| Carbon tetrachloride | " | " | " | " |
| Methylene chloride | " | " | " | " |
| Ethylene chloride | " | " | " | " |
| 1,1,1-Trichloromethane | " | " | " | " |

*i.o. = in order (no attack)

Etching test in an FeCl₃ bath

The coated Cu foils are placed in an iron-III chloride bath (30% aqueous solution) and the bath is agitated by passing a slight stream of air through it. The films remain flexible after the copper has been etched away.

C. Preparation of a printed circuit

A printed circuit is prepared by coating a laminate, prepared as described under B, on the purified copper side with a solution of a photo resist by the aid of a 20 μm-wire doctor blade and drying at 80° C. for five minutes to give a coating with a thickness of 3–4 μm.

This coating is then exposed with a 5000 w metal halide lamp through a photo mask, developed during 30 seconds in a 1% solution of Na-carbonate at 32° C., washed in water for 15 minutes and etched in FeCl₃ during 10 minutes. An excellent flexible printed circuit is obtained having also excellent adhesion on the printed circuit tracks.

What is claimed is:

1. A flexible, printed circuit with excellent adhesion of the printed circuit tracks, which is obtained by coating one side of a metal foil without any interlayer with a polymer consisting of a polyamide, polyimide or polyamide-imide which contains siloxane groups, the silicon content being 0.1 to 2.0% by weight, and is obtained by heating a silicon modified polyamide prepolymer, polyamide-acid prepolymer or polyamide-amido-acid prepolymer, of intrinsic viscosity from 0.3 to 4.0, of the formula I

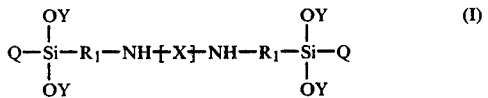

in which X is a structural element of the formula II

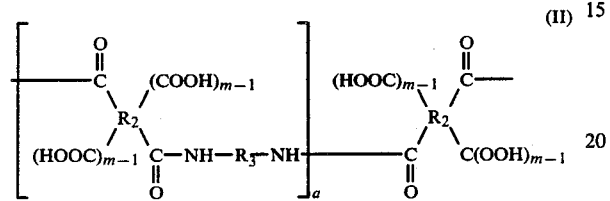

a is a number from 15 to 100 and the individual symbols or radicals m, $R_1$, $R_2$, $R_3$, Q and Y, independently of one another, are defined as follows: m is 1 or 2, $R_1$ is a

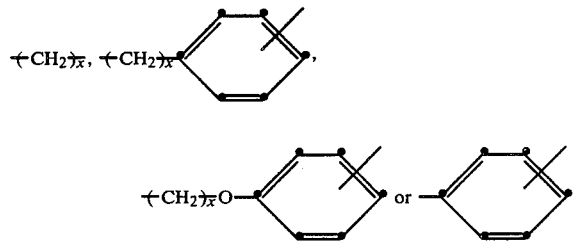

radical, x being a number from 1 to 4, $R_2$ is a carbocyclic-aromatic or heterocyclic radical, in which the carboxamide groups and carboxyl groups are bonded to different ring carbon atoms and the carboxyl groups are each in the ortho-position to a carboxamide group, $R_3$ is a carbocyclic-aromatic or heterocyclic radical, Q is methyl, phenyl or a radical —OY and Y is an alkyl radical of 1 to 6 carbon atoms or a phenyl radical, heating the coated metal foil in the temperature range from 50° to 300° C. till a tack-free coating is obtained, exposing the opposite side of the coated metal foil, which side is provided with a photolacquer, through a photo mask, and developing the exposed metal foil.

2. A circuit according to claim 1, wherein the coated metal foil is a copper foil.

3. A circuit according to claim 1, wherein the polymer consists of a crosslinked polyamide, polyimide or polyamide-imide containing siloxane groups and is obtained by heating a silicon-modified prepolymer of the formula I, wherein a is a number from 50 to 100 and m, $R_1$, $R_2$, $R_3$, Q and Y are as defined in claim 1.

4. A circuit according to claim 1, wherein the polymer consists of a crosslinked polyamide, polyimide or polyamide-imide which contains siloxane groups and is obtained by heating a silicon-modified prepolymer of the formula I, wherein the individual radicals $R_2$ independently of one another are each an unsubstituted monocyclic, fused polycyclic, or non-fused bicyclic aromatic radical, the aromatic nuclei in the last-mentioned case being linked by the bridge member —O— or —CO—, the individual radicals $R_3$, independently of one another, are each an unsubstituted monocyclic or bicyclic aromatic radical, the aromatic nuclei in the last-mentioned case being linked by a bridge member —O—, —$CH_2$—, —$C(CH_3)_2$— or —$SO_2$— or by a direct bond, and m, $R_1$, Q and Y are as defined in claim 1.

5. A circuit according to claim 1, wherein the polymer consists of a polyamide-imide and is obtained by heating a silicon-modified prepolymer of the formula I, in which m is 2, $R_2$ is a benzene ring or the benzophenone ring system and $R_3$ is a 4,4'-diphenylether or 4,4'-diphenylmethane radical, and $R_1$, Q and Y are as defined in claim 1.

* * * * *